(12) United States Patent
Nakatani et al.

(10) Patent No.: US 8,530,922 B2
(45) Date of Patent: Sep. 10, 2013

(54) ORGANIC EL DEVICE AND METHOD FOR MANUFACTURING SAME

(75) Inventors: Shuhei Nakatani, Osaka (JP); Takaaki Higashida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/510,413

(22) PCT Filed: Nov. 9, 2010

(86) PCT No.: PCT/JP2010/006569
§ 371 (c)(1),
(2), (4) Date: May 17, 2012

(87) PCT Pub. No.: WO2011/067895
PCT Pub. Date: Jun. 9, 2011

(65) Prior Publication Data
US 2012/0228602 A1    Sep. 13, 2012

(30) Foreign Application Priority Data
Dec. 4, 2009  (JP) ................................ 2009-276825

(51) Int. Cl.
*H01L 33/00*       (2010.01)
(52) U.S. Cl.
USPC .................................. 257/98; 257/40; 438/82
(58) Field of Classification Search
USPC .......................................... 257/40, 98; 438/82
See application file for complete search history.

(56) References Cited

U.S. PATENT DOCUMENTS

| 6,373,453 | B1 | 4/2002 | Yudasaka |
| 7,449,252 | B2 * | 11/2008 | Morii et al. ................... 428/690 |
| 7,777,411 | B2 * | 8/2010 | Seki ............................... 313/506 |
| 2002/0064966 | A1 | 5/2002 | Seki et al. |
| 2005/0287392 | A1 | 12/2005 | Toyoda |
| 2006/0169979 | A1 * | 8/2006 | Endo ................................ 257/59 |
| 2007/0141391 | A1 * | 6/2007 | Coggan et al. ................ 428/690 |
| 2007/0241665 | A1 | 10/2007 | Sakanoue et al. |
| 2009/0272999 | A1 * | 11/2009 | Yoshida et al. .................. 257/98 |
| 2010/0252857 | A1 * | 10/2010 | Nakatani et al. .............. 257/100 |

FOREIGN PATENT DOCUMENTS

| CN | 101543135 A | 9/2009 |
| CN | 101855742 A | 10/2010 |
| JP | 05-343183 A | 12/1993 |
| JP | 10-147771 A | 6/1998 |
| JP | 2002-222695 A | 8/2002 |

(Continued)

OTHER PUBLICATIONS

International Search Report for PCT/JP2010/006569 dated Jan. 25, 2011.

*Primary Examiner* — Jarrett Stark
*Assistant Examiner* — Nicholas Tobergte
(74) *Attorney, Agent, or Firm* — Pearne & Gordon LLP

(57) ABSTRACT

Disclosed is an organic EL device which comprises: a pixel electrode that is arranged on a substrate; a hole injection layer that is arranged on the pixel electrode and has a photocatalytic function; an organic functional layer that is formed on the hole injection layer by a coating method; a bank made of a fluorine-containing resin and defines the region where the organic functional layer is arranged; and a counter electrode that is arranged so as to cover the bank and the organic functional layer. Due to the photocatalytic function of the hole injection layer, the bank residuals can be removed by low-energy ultraviolet light that has a longer wavelength (300-400 nm) than conventional high-energy ultraviolet light that has a short wavelength (254 nm or 172 nm).

11 Claims, 6 Drawing Sheets

(56) References Cited

FOREIGN PATENT DOCUMENTS

| | | |
|---|---|---|
| JP | 2003-229261 A | 8/2003 |
| JP | 2004-171951 A | 6/2004 |
| JP | 3580092 B2 | 7/2004 |
| JP | 2004-235128 A | 8/2004 |
| JP | 2006-13139 A | 1/2006 |
| JP | 2006-114742 A | 4/2006 |
| JP | 2007-048529 A | 2/2007 |
| JP | 2007-288071 A | 11/2007 |
| WO | 2008/149498 A1 | 12/2008 |
| WO | 2009/075075 A1 | 6/2009 |

* cited by examiner

ORGANIC EL DEVICE AND METHOD FOR MANUFACTURING SAME

TECHNICAL FIELD

The present invention relates to an organic EL device and display apparatus including the organic EL device and relates to methods of manufacturing the same.

TECHNICAL FIELD

Various electronic devices such as a luminescent device, a solar cell, other semiconductor devices have been actively studied and developed. Among the electronic devices, the organic EL device, one of the organic electronic devices having an organic functional layer is expected to be applied to a next-generation thin display, and in recent years the organic EL device has been extremely actively studied.

The organic EL device has a structure in which an organic functional layer having a light emitting layer is placed between an anode and a cathode. In the organic EL device, holes and electrons are injected from the anode and the cathode, respectively, into the light emitting layer and the holes and the electrons are recombined in the light emitting layer to emit a light. The organic EL device has characteristics of, for example, high visibility due to its self-luminescence and excellent shock-resistant because it is a complete solid element, and therefore application as a luminescent device in various display apparatus has been expected (for example, see Patent Literature 1). The organic EL device has already been applied to various uses such as main displays for mobile phones.

In the current development and the application stage, development of an organic EL device having a light emitting layer made of a low molecular organic material has preceded. This is because the light emitting layer made of a low molecular organic material has a high efficiency of light emission and has long life (for example, see Patent Literatures 2 and 3). The light emitting layer made of a low molecular organic material is made by a vacuum process such as vacuum deposition.

However, it is difficult to mass-produce a large organic EL display of 100-inch class by the manufacturing technique of the organic EL device using this vacuum process. This is because it is difficult to accurately maintain the arrangement of a mask for each of the colors used for forming the light emitting layer by vapor deposition (for example, red (R), green (G), and blue (B)). Further, the organic EL display having the light emitting layer formed by vapor deposition is inferior to a crystal liquid display, which competes with the organic EL display, in cost, and thus further improvement has been desired.

To solve this problem, a technique is also known in which the organic functional layer is formed by wet printing. Printing methods are superior to other methods in, for example, The efficiency of using materials, manufacturing time, and the cost of the manufacturing apparatus. Further, when the light emitting layer is formed by the printing methods, it is possible to separately coat each of pixels arranged on a large panel. Accordingly, unlike the case in which the light emitting layer is formed by vacuum deposition, a problem of non-uniformity of coating or a problem arisen by distortion of metal masks used for patterning a deposition layer will not occur.

For the above reason, in recent years, studies on and development of manufacture of the organic light emitting layer made of a polymeric organic material by wet printing have been advanced. Examples of the wet printing include spin coating, ink jetting, die coating printing, relief printing, and intaglio printing. Among those, studies on a method of forming the organic light emitting layer by ink jetting have been actively conducted (for example, see Patent Literature 4).

On the other hand, when the organic functional layer of the organic EL display is formed by the printing method such as ink-jetting, it is necessary to arrange partition walls called banks to prevent color mixing in a display in which coating solutions applied to a pixel and the pixels adjacent to that pixel are mixed. The organic functional layer made of a polymeric organic material is formed by applying the coating solution in a region defined by such a bank and drying the solution. The bank is generally formed by patterning a resin such as polyimide or acryl using photolithography.

Further, when the organic functional layer is formed by ink jetting, a coating solution with a high boiling point and low viscosity is used so that ink-jet nozzles are not clogged. Such a coating solution with a high boiling point and low viscosity is an extremely dilute solution containing several percent (percent by weight) of a material.

In order to form the organic functional layer having a final thickness (thickness after drying) of, for example, 100 nm using such a coating solution, a film in a wet state that is immediately after the coating solution is applied is supposed to have a thickness of around 10 μm. Because the bank is generally 1 to 3 μm high, the bank needs to hold droplets having three to ten times its height. Therefore, the bank needs to be lyophobic against the coating solution.

As a method for providing the bank with lyophobicity, there are mainly two methods: plasma treatment and provision of fluorine compounds.

The plasma treatment refers to treatment of a substrate having banks with plasma of a fluorocarbon gas. The plasma treatment will be described with reference to a structural cross-sectional view of a conventional organic EL device shown in FIG. 1. First, as shown in FIG. 1, pixel electrode 101 is formed on substrate 100 such as a glass substrate having TFTs for driving, and then inorganic bank 102 and organic bank 103 are formed along the edge of pixel electrode 101. Organic bank 103 is formed by photolithography.

When organic bank 103 is formed by photolithography, bank residues may be attached on a layer arranged under the bank (pixel electrode 101). For this reason, generally, treatment for removing the bank residues (organic substance) is performed after the bank is formed. Examples of the treatment for removing the bank residues include ultraviolet light (UV) irradiation treatment in which the bank residues are decomposed by irradiation with ultraviolet light, and oxygen plasma treatment in which oxygen under air atmosphere is used as treatment gas (for example, see Patent Literature 5). By performing such a treatment, the layer arranged under the bank (underlying layer) (pixel electrode 101) can be cleaned and the lyophilicity of the underlying layer (pixel electrode 101) can be improved. Afterward, the bank is treated with plasma of a fluorocarbon gas to provide the bank with lyophobicity. Afterward, hole transport layer 104, light emitting layer 105, and common electrode 106 are formed. When the bank is provided with lyophobicity by plasma treatment in this way, the bank residues can be removed relatively easily by irradiation with ultraviolet light or by oxygen plasma treatment.

However, in plasma treatment, a trace amount of fluorine compounds are also attached on the pixel electrode. When the fluorine compounds that have been attached on the pixel electrode are diffused into the organic functional layer, device characteristics will be degraded. Further, as the substrate becomes larger, it will be difficult to perform plasma treatment uniformly on the substrate in the direction of the plane of the substrate, causing variation of lyophobicity of the bank in the direction of plane of the substrate. Accordingly, variation in the thickness and in uniformity of the organic functional layer occurs among elements.

On the other hand, in a method for providing the bank with lyophobicity by providing the bank with fluorine compounds, fluorine compounds are contained in a resin material of the bank. This method can provide the bank with lyophobicity without performing plasma treatment. According to this method, the bank having lyophobicity can be formed only by photolithography, simplifying the process and allowing inexpensive manufacture of the bank. Further, because variation of lyophobicity of a large substrate, which is a problem arisen in plasma treatment, is drastically reduced, a device with an excellent property can be manufactured inexpensively.

Further, a technique is known in which the hole injection layer is formed by, for example, spin coating over the substrate having the pixel electrode, in order to make the hole injection layer flat, which is formed by coating (for example, see Patent Literature 6). In Patent Literature 6, a pixel electrode is formed on a provided substrate; a hole injection layer is formed by applying a solution containing, for example, PEDOT over the substrate having a pixel electrode by spin coating; a bank is formed on the hole injection layer; and an organic light emitting layer is formed by applying an organic light-emitting material in a region defined by the bank. Therefore, in Patent Literature 6, the hole injection layer is not divided for each element, but the hole injection layer is shared with all elements. Further, Patent Literature 6 discloses that wettability on the surface of the hole injection layer is improved by dispersing photocatalyst in the hole injection layer, so that the organic light emitting layer, which is to be applied on the hole injection layer, is formed to have uniform thickness.

CITATION LIST

Patent Literature

PTL 1
Japanese Patent Application Laid-Open No. 2004-171951
PTL 2
Japanese Patent Application Laid-Open No. 2007-288071
PTL 3
Japanese Patent Application Laid-Open. No. 2002-222695
PTL 4
Japanese Patent No. 3580092
PTL 5
Japanese Patent Application Laid-Open No. 2006-13139
PTL 6
Japanese Patent Application Laid-Open No. 2004-235128

SUMMARY OF INVENTION

Technical Problem

However, when the bank made of a fluorine compound-containing resin is formed, there is a problem that bank residues are attached on the layer arranged under the bank (the pixel electrode or the hole injection layer). The bank residues that is attached on the layer arranged under the bank causes lowered efficiency for light emission and shortened life of the organic EL device.

On the other hand, as is explained for the plasma treatment method, another approach is also possible in which after the bank is formed using a fluorine compounds-containing resin material, bank residues are removed from the surface of the layer arranged under the bank so as to clean the layer arranged under the bank by irradiation with ultraviolet light, or by oxygen plasma treatment. The light source used for the ultraviolet irradiation is an excimer lamp or a low-pressure mercury lamp. Further, generally, the wavelength for ultraviolet irradiation is selected from 172 nm, 185 nm, or 254 nm.

However, when the bank made of a fluorine compound-containing resin is irradiated with ultraviolet light or subjected to oxygen plasma treatment, lyophobicity of the bank itself disappears and the intended function of the bank of holding droplets will also disappear. This is apparently because carbon-fluorine bonds on the surface of the bank is cleaved by the energy of the ultraviolet light or the oxygen plasma so that fluorine that has been on the surface of the bank will disappear.

Further, another approach is possible in which an adjustment is done to prevent carbon-fluorine bonds on the surface of the bank from being cleaved, by using ultraviolet light for irradiation having a relatively long wavelength (for example, around 365 nm) in order to remove bank residues and thus lowering the energy of the ultraviolet light. However, when the ultraviolet light for irradiation has a relatively long wavelength (for example, around 365 nm), almost no bank residues can be removed.

As described above, there is a problem that, when the fluorine compound-containing resin is used as a material of the bank, it is difficult to remove the bank residues while retaining lyophobicity of the bank.

The present invention has been developed in view of the above, and it is therefore an object of the present invention to provide an organic EL device and methods of manufacturing the same, the organic EL device that makes it possible to remove bank residues while retaining lyophobicity of the bank, even when a fluorine compound-containing resin, which is required to inexpensively manufacture an organic EL device with a high productivity, is used as a material of the bank.

Solution to Problem

The present inventors established that, by providing the hole injection layer with a photocatalytic function, the bank residues can be removed from the hole injection layer using a low-energy ultraviolet light having a long wavelength of 300 to 400 nm. The inventors conducted additional studies and completed the present invention.

That is, a first aspect of the present invention relates to an organic EL device given below.

[1] An organic EL device including:
a pixel electrode arranged on a substrate;
a hole injection layer arranged on the pixel electrode, the hole injection layer made of a metal oxide having a photocatalytic function;
an organic functional layer formed on the hole injection layer by coating;
a bank made of a fluorine-containing resin, the bank defining a region in which the organic functional layer is arranged; and
a counter electrode arranged so as to cover the bank and the organic functional layer.

[2] The organic EL device according to [1], wherein the hole injection layer contains titanium oxide.

[3] The organic EL device according to [2], wherein the hole injection layer further contains tungsten oxide.

[4] The organic EL device according to [2], wherein the hole injection layer further contains molybdenum oxide.

[5] The organic EL device according to [2], wherein the hole injection layer further contains tungsten oxide and molybdenum oxide.

[6] The organic EL device according to [1], wherein a concentration of fluorine atoms on a top surface of the bank is 5 to 10 atom %, and a contact angle of anisole on a surface of the bank is 40 to 50°.

A second aspect of the present invention relates to a method of manufacturing the organic EL device given below.

[7] A method of manufacturing an organic EL device including:
providing a substrate;
forming a pixel electrode on the substrate;
forming on the pixel electrode a hole injection layer made of a metal oxide having a photocatalytic function;
forming a bank made of a fluorine-containing resin on the substrate so that at least part of the hole injection layer is exposed;
irradiating the hole injection layer with a light after the bank is formed;
forming an organic functional layer on the hole injection layer by coating; and
forming a counter electrode on the organic functional layer.

[8] The method of manufacturing the organic EL device according to [7], wherein a peak wavelength of the light is 300 to 400 nm.

[9] The method of manufacturing the organic EL device according to [7], wherein the hole injection layer is formed by vapor deposition or sputtering.

Advantageous Effects of Invention

According to the present invention, by virtue of a photocatalytic function of the hole injection layer, bank residues can be removed using a low-energy ultraviolet light having a long wavelength of 300 to 400 nm, without using a conventional high-energy ultraviolet light having a short wavelength of 254 or 172 nm. For this reason, cleavage of carbon-fluorine bonds does not occur on the surface of the bank due to irradiation, so that lyophobicity of the bank is not impaired. Accordingly, according to the present invention, it is possible to retain lyophobicity of the bank while removing bank residues from the surface of the hole injection layer.

DESCRIPTION OF EMBODIMENTS

Figure 1:
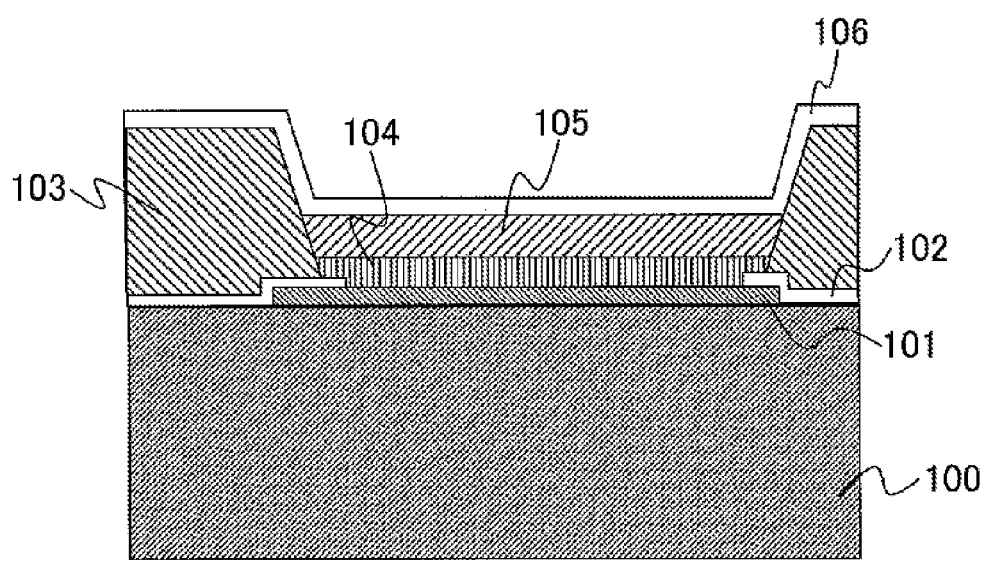
FIG. 1 is a cross-sectional view of one example of a conventional organic EL device.

1. Method of Manufacturing Organic EL Device of the Present Invention

A method of manufacturing an organic EL device of the present invention includes: 1) a first step of providing a substrate, 2) a second step of forming a pixel electrode on the substrate, 3) a third step of forming on the pixel electrode a hole injection layer made of a metal oxide having a photocatalytic function, 4) a fourth step of forming a bank on the substrate, 5) a fifth step of irradiating the hole injection layer with a light after the bank is formed, 6) a sixth step of forming an organic functional layer on the hole injection layer, and 7) a seventh step of forming a counter electrode on the organic functional layer. Each step will be described in detail below.

1) In the first step, a substrate is provided.

The substrate is a glass substrate, for example. Further, the substrate may be a TFT panel having inside TFTs for driving the organic EL device.

2) In the second step, a pixel electrode is formed on the substrate.

The pixel electrode is formed by forming a film of an electrode material on the substrate by, for example, sputtering and patterning the film.

3) In the third step, a hole injection, layer made of a metal oxide having a photocatalytic function is formed on the pixel electrode.

In this way, a feature of the present invention lies in that the hole injection layer has a photocatalytic function. Examples of such a metal oxide having a photocatalytic function include titanium oxide ($TiO_x$). The hole injection layer may be a film made only of titanium oxide, and may be a mixed film formed by doping a transition metal oxide film such as tungsten oxide ($WO_x$) and molybdenum oxide ($MoO_x$) with titanium oxide ($TiO_x$).

The hole injection layer may be formed by: forming the film of the material of the hole injection layer on the substrate and the pixel electrode; and patterning the film of the material of the hole injection layer. In order to form the film of the material of the hole injection layer on the substrate and the pixel electrode, for example, vapor deposition or sputtering may be employed.

The pixel electrode and the hole injection layer may be patterned at the same time, or the hole injection layer may be formed after the pixel electrode is patterned.

4) In the fourth step, a bank is formed on the substrate.

The bank is formed by, for example, patterning by photolithography a film made of a photosensitive resin film formed on the substrate, and by baking the patterned film. The photosensitive resin may be a negative type or a positive type. The bank is formed so that at least part of the hole injection layer is exposed. That is, the bottom surface of the bank is in contact with the substrate, but part of the bottom surface of the bank may be positioned on the hole injection layer.

According to the present invention, the bank has a high lyophobicity. To improve lyophobicity of the bank, the material of the bank may be a fluorine-containing resin. In this way, according to the present invention, the bank may be formed by baking (heating) the film of fluorine resin-containing composition that is patterned into a desired shape. Therefore, the bank has carbon-fluorine bonds on the surface. Further, after the bank is formed, the wettability of the bank may be controlled by further subjecting the bank and the surface of the hole injection layer to plasma-treatment.

When the bank is formed by what is called photolithography as described above, it is generally difficult to remove residues of the material of the bank only in the development process. For this reason, bank residues are attached on a layer arranged under the bank (hole injection layer). The molecular level of residues attached to the hole injection layer remain although they are not confirmed by visual inspection such as optical microscopy. In an organic EL device, even such a trace amount of residues may cause degradation of the device characteristics. Therefore, the bank residues need to be removed after the bank is formed.

5) In the fifth step, the region of the hole injection layer that is defined by the bank is irradiated with a light.

The irradiation is preferably performed in a chamber. A light for irradiation is preferably an ultraviolet ray having a long wavelength. Here, the ultraviolet ray refers to a light having a wavelength of 10 to 400 nm. More specifically, the light for irradiation preferably has a peak wavelength of 300 to 400 nm. This is because, when the light has a peak wavelength of less than 300 nm, lyophobicity of the bank is likely to be lost due to irradiation, and when the peak wavelength of the light is over 400 nm, the hole injection layer cannot perform a photocatalytic function. It is in particular preferable that the light for irradiation have a broad range of wavelength with a main peak of 365 nm, for example. Further, the light for irradiation preferably does not contain a light having a wavelength of less than 300 nm and more preferably does not contain a light having a wavelength of less than 350 nm. This is because, when the light for irradiation contains a light having a wavelength of less than 300 nm, fluorine atoms may be removed from the top surface of the bank and thus lyophobicity of the bank is likely to be lost. In order to cut a light having a particular wavelength from the light for irradiation, for example, a cut filter may be used.

The dose of irradiation (illuminance×irradiation time) is in particular not limited, and for example, the illuminance may be 10 to 100 mW/cm$^2$ and the irradiation time may be 10 to 200 minutes.

Because the hole injection layer according to the present invention has a photocatalytic function as described above, irradiating the hole injection layer with a light allows the hole injection layer to perform the photocatalytic function. By virtue of the photocatalytic function of the hole injection layer, bank residues that have remained on the surface of the hole injection layer are removed and almost no bank residues will remain on the hole injection layer. Here, "photocatalyst" is a material that can produce strong oxidation power on the surface when irradiated with a light, so that organic compounds or the like can be removed from the surface. Hereinafter, a mechanism by which the photocatalyst will produce the oxidation power will be described.

When the photocatalyst (titanium oxide) is irradiated with a light having more than constant energy (band gap energy of the photocatalyst), electrons are released from the surface of the photocatalyst to produce holes having positive charge. These holes react with hydroxide ions (OH$^-$) of moisture in the atmosphere and oxygen in the atmosphere to produce active oxygen such as OH radicals and super oxide anions ($O_2^-$). Such active oxygen is extremely reactive. In particular, because OH radicals have greater energy than the bond energy in molecules of the organic compounds, the OH radicals can cleave bonds in the molecules of the organic compounds. By this means, organic substances are decomposed on the surface of the photocatalyst.

For this reason, by irradiating the hole injection layer (photocatalyst) with a light, the bank residues (organic compounds) can be removed from the surface of the hole injection layer.

Next, the wavelength of a light required to allow the hole injection layer to perform a photocatalytic function will be described. Titanium oxide is a semiconductor and becomes in the state of high energy by obtaining the energy of a light. At this time, when the energy obtained from the light is more than the band gap energy of the titanium oxide, electrons in the valence band transit to the conduction band and the titanium oxide releases electrons from the surface on which the light is applied, allowing the hole injection layer to perform the photocatalytic function.

Energy E of a light can be determined using $E=h\nu$ (h: Planck's constant ($6.63\times 10^{-34}$ J·S), v: frequency), and frequency v can be determined by $v=c/\lambda$ (c: the speed of light ($3.0\times 10^8$ m/s), λ: wavelength). Accordingly, energy E of the light can be expressed as follows:

$$E=hc/\lambda$$

Further, the band gap energy of titanium oxide is 3.2 eV (=$5.12\times 10^{-19}$ J). When this value is substituted to the above equation, λ (wavelength) is around 380 nm. Accordingly, irradiating the photocatalyst with a light having a wavelength of 380 nm or less allows the hole injection layer to perform the photocatalytic function.

In this way, according to the present invention, by virtue of the photocatalytic function of the hole injection layer, the bank residues can be removed using a low-energy ultraviolet light having a long wavelength of 300 to 400 nm. Therefore, due to irradiation, cleavage of the carbon-fluorine bonds does not occur on the surface of the bank, so that lyophobicity of the bank is not impaired.

6) In the sixth step, an organic functional layer is formed on the hole injection layer by wet printing (coating).

Examples of the wet printing include ink jetting, dispensing, nozzle coating, spin coating, intaglio printing, and relief printing. By forming the organic functional layer by wet printing, it is possible to easily make the organic functional layer having a uniform thickness on a large substrate. Here, "ink jetting" refers to a technique in which coat is formed by jetting a coating solution from nozzles to apply the coating solution to a desired region to form a coated film.

More specifically, in the sixth step, the coating solution containing an organic function material is applied in the region defined by the bank. The organic functional layer is formed on the pixel electrode by drying the applied coating solution. The coating solution containing an organic function material is prepared by dissolving an organic function material in an organic solvent such as anisole or cyclohexylbenzene.

As described above, according to the present invention, because lyophobicity of the bank is retained, overflow of the coating solution of the organic functional layer will not occur at the region defined by the bank. For this reason, according to the present invention, the organic functional layer can be formed in the desired region.

After the organic functional layer is formed, a counter electrode is stacked and a sealing film is further formed thereon, to make an organic EL device.

In this way, according to the present invention, by virtue of the photocatalytic function of the hole injection layer, bank residues can be removed using the low-energy ultraviolet light having a long wavelength of 300 to 400 nm. For this reason, cleavage of carbon-fluorine bonds does not occur on the surface of the bank by irradiation, so that lyophobicity of the bank is not impaired.

Therefore, according to the present invention, it is possible to retain lyophobicity of the bank while removing the bank residues from the surface of the hole injection layer, making it possible to manufacture the organic EL device using a printing method having a high productivity. For this reason, according to the present invention, a large organic EL panel (for example, 100 inch class) can be produced easily, making it possible to mass-produce the large organic EL panel.

2. Organic EL Device of the Present Invention

An organic EL device of the present invention is the organic EL device manufactured by the above method of manufacturing the organic EL device of the present invention.

The organic EL device of the present invention includes a substrate, a pixel electrode arranged on the substrate, a hole injection layer arranged on the pixel electrode, an organic functional layer formed on the hole injection layer by coating, a bank that defines a region in which the organic functional layer is arranged, and a counter electrode arranged on the organic functional layer. Each component will be described below.

[Substrate]

The choice of the material of the substrate varies depending on whether the organic EL device is of bottom emission type or top emission type. For example, in the case of the bottom emission type, the substrate needs to be transparent. Accordingly, in the case of the bottom emission type, examples of a material of the substrate include glass, quartz, and transparent plastics. On the other hand, in the case of the top emission type, the substrate does not need to be transparent. Accordingly, in the case of the top emission type, any material can be used for the substrate so long as it is insulating, with the example being opaque plastics and silicon.

By using plastics such as polyethylene terephthalate or polyethersulfone as the material of the substrate, a flexible organic EL device can be manufactured. Further, the substrate may be a TFT panel having a metal interconnection or a transistor circuit for driving the organic EL device.

[Pixel Electrode]

A pixel electrode is an electrically conductive member arranged on the substrate. The pixel electrode generally functions as an anode. Examples of a material of the pixel electrode include Al and Ag, and their alloys. The pixel electrode has a thickness of 100 to 300 nm, for example. Further, the pixel electrode is preferably formed by sputtering, like a hole injection layer (described later). By this means, the pixel electrode and the hole injection layer can be formed using the same vacuum chamber, making the manufacturing process simpler.

[Hole Injection Layer]

A hole injection layer is arranged on the pixel electrode and has a function of stably injecting holes in an organic light emitting layer. Further, the hole injection layer has a function of facilitating production of holes. By providing the hole injection layer, drive voltage of the organic EL device lowers, extending the life of the device. The hole injection layer preferably has a thickness of around 5 to 50 nm, for example.

The hole injection layer preferably has a flat surface. When the hole injection layer has a flat surface, the organic functional layer to be formed on the hole injection will also have a flat surface, allowing the organic functional layer to have an uniform thickness across the device. The organic functional layer having the uniform thickness can prevent deviation of the electric field between the electrodes, acceleration of degradation due to the deviation, and local light emission and a short circuit in the pixel.

A feature of the present invention lies in that the hole injection layer is made of a metal oxide having a photocatalytic function. Examples of such a metal oxide having a photocatalytic function include titanium oxide ($TiO_x$). A fact that titanium oxide ($TiO_x$) functions as the hole injection layer is described in, for example, Japanese Patent Application Laid-Open No. 5-343183. Further, the hole injection layer may include molybdenum oxide ($MoO_x$) and tungsten oxide ($WO_x$), which are transition metal oxides, and their mixtures. That is, the hole injection layer may be a mixed film formed by doping a transition metal oxide film made of tungsten oxide ($WO_x$) or molybdenum oxide ($MoO_x$) with titanium oxide ($TiO_x$). A structure in which the mixed film of titanium oxide with, for example, tungsten oxide ($WO_x$) or molybdenum oxide ($MoO_x$) has the photocatalytic function, is described in, for example, Japanese Patent Application Laid-Open No. 10-147771.

In this way, by forming the hole injection layer from the metal oxide having the photocatalytic function, the hole injection layer is provided with the photocatalytic function. On the other hand, it is also possible to provide the hole injection layer with the photocatalytic function by dispersing the metal oxide having the photocatalytic function (photocatalyst) in the hole injection layer which include matrix material not having a photocatalytic function. However, in the case where the hole injection layer is provided with the photocatalytic function by dispersing the photocatalyst into the hole injection layer, the area of the photocatalyst to be occupied on the surface of the hole injection layer will be relatively small, and thus it may be not possible to provide the surface of the hole injection layer with a sufficient photocatalytic function.

As described above, according to the present invention, by virtue of the photocatalytic function of the hole injection layer that is effected by irradiation of the low-energy ultraviolet light having a long wavelength of 300 to 400 nm, almost no bank residues (i.e. fluorine resin) will remain on the surface of the hole injection layer. More specifically, it means that the concentration of fluorine atoms, which are components of the bank on the surface of the hole injection layer, is 0.1 atom % or less. The concentration of the fluorine atoms on the surface of the hole injection layer may be measured by X-ray photoelectron spectrometer (XPS or ESCA) after removing the stacked function layer to expose the surface of the hole injection layer.

[Bank]

A bank is a partition wall that defines a region in which an organic functional layer is arranged. The bank is arranged on the substrate so that at least part of the hole injection layer is in contact with the organic functional layer. The height of the bank, i.e. distance from the bottom surface of the bank to the vertex of the bank, is 0.1 to 2 μm, and in particular preferably is 0.8 to 1.2 μm. When the height of the bank is 2 μm or more, a counter electrode (described later) is likely to be segmented by the bank. Further, the height of the bank is 0.8 μm or less, overflow of the ink that has been applied in the region defined by the bank is likely to occur at the bank. Further, the bank is preferably formed in a forward tapered shape.

The material of the bank is an insulator with a volume resistivity of $10^5$ Ω·cm or more. When the material of the bank is a material having the volume resistivity of less than $10^5$ Ω·cm, leak current occurs between the pixel electrode and the counter electrode or between a pixel and the adjacent pixels. When such leak current occurs, various problems arise such as increase of power consumption.

The material of the bank is a fluorine-containing resin. Examples of fluorine compounds contained in the fluorine-containing resin include vinylidene fluoride, vinyl fluoride, ethylene trifluoride, and their copolymers. Further, examples of a resin contained in the fluorine-containing resin include phenol-novolac resins, polyvinylphenol resins, acrylic resins, methacrylic resins, and their combinations. The concentration of fluorine atoms of the fluorine-containing resin is in particular not limited, with the preference of 0.1 to 30 atom %.

The concentration of the organic function material in the coating solution of the organic functional layer formed by wet printing is as low as several % by weight, as described above. Thus, in order to obtain an organic functional layer having a desired thickness, the bank needs to hold droplets having a height of around three to ten times its height. For this reason, the bank needs to have a high lyophobicity.

On the other hand, in the case where the bank is lyophilic, the difference of lyophilicity between the surface of the hole injection layer (lyophilic) and the surface of the bank becomes smaller, making it difficult to selectively retain the coating solution of the organic functional layer in the region defined by the bank.

As described above, according to the present invention, because bank residues can be removed using the low-energy ultraviolet light having a long wavelength of 300 to 400 nm, cleavage of the carbon-fluorine bonds does not occur on the surface of the bank, maintaining the concentration of fluorine atoms on the surface of the bank high. By this means, lyophobicity on the surface of the bank is retained. "The concentration of fluorine atoms on the surface of the bank is high" means that the concentration of fluorine atoms on the surface of the bank is 5 to 10 atom %. Further, "lyophobicity of the surface of the bank is high" means that the contact angle of anisole on the surface of the bank is 40 to 50°.

Further, according to the present invention, the bank preferably has a gradient of the fluorine concentration along the thickness direction of the bank. Specifically, it is preferable that the fluorine concentration of the bank preferably increases from the bottom surface of the bank toward the vertex of the bank. More specifically, according to the present invention, it is preferable that the concentration of fluorine atoms be 5 to 10 atom % on the surface of the bank and 0 to 3 atom % on the bottom surface of the bank. The concentration of the fluorine atoms can be measured by an X-ray photoelectron spectrometer (also referred to as XPS or ESCA).

In order to form the gradient of the fluorine concentration along the thickness direction of the bank in this way, the bank may be made in a forward tapered shape and the bank may be formed by baking a film of fluorine resin-containing composition that is patterned into a desired shape.

Hereinafter, a mechanism will be described by which a gradient of the fluorine concentration is formed along the height of the bank when the bank is made into the forward tapered shape and the bank is formed by baking the patterned film of fluorine resin-containing composition into a desired shape. Table 1 shows the relationship between the height of the bank formed by baking (heating) the film of fluorine resin-containing composition and the fluorine concentration on the surface of the bank.

TABLE 1

| Height (μm) | Contact angle of water | Contact angle of anisole | Fluorine concentration (atom %) |
| --- | --- | --- | --- |
| 1 | 81.2° | 45.5° | 7.5 |
| 0.9 | 78.9° | 43.0° | 6.9 |
| 0.8 | 76.5° | 40.6° | 6.3 |
| 0.7 | 74.1° | 38.2° | 5.6 |
| 0.6 | 71.7° | 35.7° | 5.0 |
| 0.5 | 69.4° | 33.3° | 4.3 |
| 0.4 | 67.0° | 30.8° | 3.7 |
| 0.3 | 64.6° | 28.4° | 3.0 |
| 0.2 | 62.2° | 25.9° | 2.4 |
| 0.1 | 59.9° | 23.5° | 1.7 |

As shown in Table 1, as the height of the bank becomes higher, the fluorine concentration on the surface of the bank increases and both of the contact angle of water and the contact angle of anisole become greater, i.e. the wettability decreases.

Figure 2:
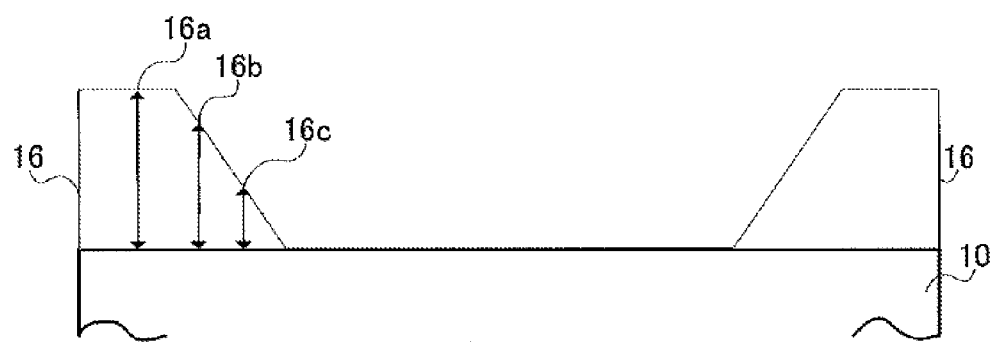
FIG. 2 is a cross-sectional view of a bank according to the present invention.

Further, as described above, the bank is made into the forward tapered shape, a slope is formed on the wall surface of the bank. That is, as shown in FIG. 2, the height of the bank decreases in order of 16a, 16b, and 16c.

As described above, the density of fluorine components decreases on the surface of lower part of the bank and the density of fluorine components increases on the surface of higher part of the bank. Therefore, among three parts of banks 16 formed into a forward tapered shape shown in FIG. 2, the fluorine concentration is relatively high in the part shown as 16a (higher part of the bank), and the fluorine concentration is relatively low in the part shown as 16c (lower part of the bank). Accordingly, the fluorine concentration in bank 16 decreases in order of 16a, 16b, and 16c. In FIG. 2, reference sign 10 denotes a TFT panel.

By forming the gradient of the fluorine concentration in the direction of the height of the bank in this way, the gradient of wettability can be obtained along the height of the bank. By this means, bank surface 16a having low wettability plays the intended role of the bank, i.e. suppressing overflow of the material of the function layer from a region defined by the bank; and because the wettability of lower part 16c of the wall surface of the bank is high, the organic functional layer is reliably arranged in the whole region defined by the bank, i.e. up to the boundary line of the bank and the region.

[Organic Functional Layer]

An organic functional layer is a layer containing at least an organic light emitting layer. The organic functional layer is formed on the hole injection layer by wet printing (coating) as described above. By forming the organic functional layer by wet type film formation methods such as ink jetting or spin coating, it is possible to easily form an uniform organic functional layer on a large substrate. The thickness of the organic functional layer is in particular not limited, but may be around 50 to 200 nm, for example.

The organic EL material contained in the organic light emitting layer of the organic functional layer may be polymeric or a low molecular organic EL material, but preferably is a polymeric organic EL material in order to form the organic EL material by coating. Further, the organic EL device having the organic light emitting layer made of the polymeric organic EL material has a simple device structure, has highly reliable films, and is driven by low voltage.

The polymeric organic EL material includes polymers having a conjugated system such as an aromatic ring or a condensed ring or includes π conjugated system polymers. Examples of a material of such a polymeric organic EL material include polyphenylenevinylene (PPV) and its derivatives, polyacetylene and its derivatives, polyphenylene (PP) and its derivatives, polyparaphenylene ethylene and its derivatives, poly-3-hexylthiophene (P3HT) and its derivatives, polyfluorene (PFO) and its derivatives, and polyspirofluorene derivatives polythiophene and its derivatives.

The organic functional layer may include the hole transport layer (interlayer) in addition to the organic light emitting layer. The hole transport layer has a function of efficiency transporting holes into the organic light emitting layer and a function of preventing electrons from intruding into the pixel electrode (or the hole injection layer). Further, the hole transport layer prevents deactivation of excitons at the interface between the organic light emitting layer and the hole injection layer. Accordingly, the hole transport layer is arranged between the pixel electrode and the organic light emitting layer.

A material of the hole transport layer is a hole-transporting organic material. The hole-transporting organic material refers to an organic substance that transports the produced holes by the inter-molecular charge transfer reaction, and is also called a p-type organic semiconductor. The hole-transporting material may be a polymeric or a low molecular material, with the examples being triphenylamine and polyaniline.

Further, when the coating solution containing the organic light-emitting material is applied on the hole transport layer, the hole-transporting material in the hole transport layer is preferably cross-linked material so that the hole transport layer is hard to be dissolved in the coating solution. In order to cross-link the hole-transporting material, a cross-linking agent may be contained in the coating solution of the hole transport layer. Examples of the cross-linking agent include di-pentaerythritol polyacrylate. The hole transport layer may be formed by applying on the hole injection layer a coating solution of the hole transport layer (for example, a solution prepared by dissolving a material of the hole transport layer into an organic solvent such as anisole or cyclobenzene). The thickness of the hole transport layer is in particular not limited, but may be around 10 to 40 nm, for example.

[Counter Electrode]

A counter electrode is an electrically conductive member to be arranged on the organic functional layer. The counter electrode generally functions as a cathode, and has a function of injecting electrons into the device (in particular, into the organic light emitting layer).

The selection of the material of the counter electrode varies depending on whether the organic EL device is of bottom emission type or top emission type. In the case of the organic EL device of top emission type, the counter electrode needs to be transparent. Therefore, the material of the counter electrode is preferably an electrically conductive member having a transmittance of 80% or more. By this means, it is possible to obtain an organic EL device of top emission type having the high efficiency of light emission, and to obtain a long-life organic EL device that requires low power consumption.

The material of such a transparent electrode is in particular not limited, but may be a metal oxide layer. Examples of the material of this metal oxide layer include indium tin oxide (hereinafter, also referred to as "ITO") and indium zinc oxide (hereinafter, also referred to as "IZO").

On the other hand, when the organic EL device is of bottom emission type, any material can be used for the counter electrode so long as it is light-reflecting and is electrically conductive.

Further, an electron injection layer may be arranged between the organic functional layer and the counter electrode. The electron injection layer has a function of facilitating the injection of electrons into the organic light emitting layer and thus lowering the drive voltage of the organic EL device, and a function of suppressing deactivation of excitons. By this means, it is possible to inject electrons stably to prolong the life of the device, and strengthen adherence of the organic functional layer with the transparent cathode to improve the uniformity of the light-emitting surface, decreasing defects of the device.

Examples of a material of the electron injection layer include barium, aluminium, phthalocyanine, lithium fluoride, and a barium-aluminium stack. The electron injection layer has a thickness of around 2 to 50 nm, for example.

The organic EL device has a sealing film on the counter electrode. The sealing film has a function of protecting the device from moisture. When the organic EL device does not have the sealing film, detachment between, for example, the electrode and the organic functional layer occurs due to moisture, and dot- or circular-shaped non-luminous defects, which are called "dark spots," will appear. The sealing film is made of SiN, SiON, or an organic film, for example. Further, the sealing film has a thickness of around 20 to 5000 nm, for example.

Such an organic EL device may be applied to an organic EL display. The organic EL display includes organic EL devices, arranged in a matrix pattern, of the present invention.

Now, an embodiment of the present invention will be described in detail with reference to the accompanying drawings. In the following drawing, the parts having essentially the same function will be assigned the same reference signs for easier explanation. Further, the present invention is not limited to the following embodiment.

[Organic EL Device of the Present Invention]

Figure 3:
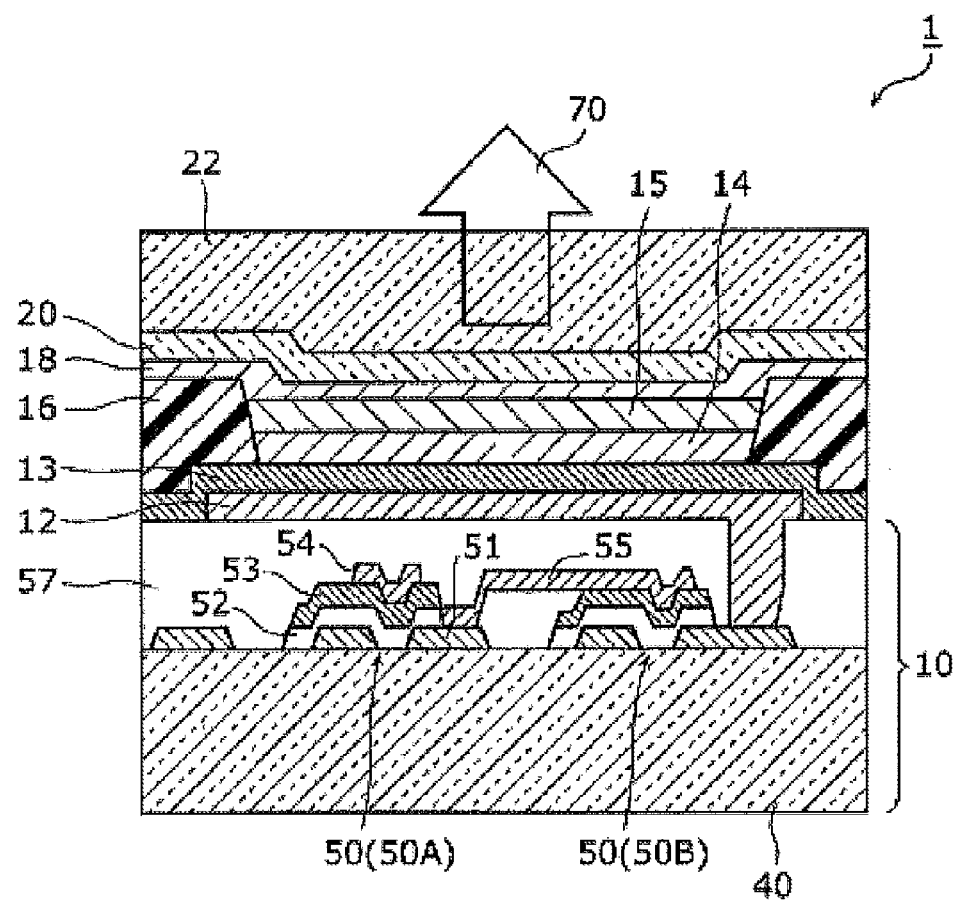
FIG. 3 is a structural cross-sectional view of an organic EL device of active matrix type according to one illustrated embodiment of the present invention.

FIG. 3 is a cross-sectional view of an organic EL device of the present invention. Organic EL device 1 shown in FIG. 3 is of top emission type and of active matrix type.

Organic EL device 1 shown in FIG. 3 includes TFT panel 10, anode 12, hole injection layer 13, hole transport layer 14, organic light emitting layer 15, bank 16, electron injection layer 18, transparent cathode 20, and transparent sealing film 22.

TFT panel 10 includes plate 40, transistor elements 50A and 50B arranged on plate 40, planarization film 57 arranged on plate 40 so as to cover the transistor elements.

Plate 40 is a glass plate, for example. Alternatively, plate 40 may be a flexible plate made of a resin.

Transistor elements (50A and 50B) arranged on plate 40 are thin film transistors (TFTs). Transistor elements 50 (50A and 50B) include source/drain electrode 51, semiconductor layer 52 formed so as to be in contact with source/drain electrode 51, gate insulation film 53 formed on semiconductor layer 52, and gate electrode 54 arranged on gate insulation film 53. Two transistor elements 50 (50A and 50B) are electrically connected by interconnection 55. This structure makes organic EL device 1 of active matrix type.

Planarization film 57 is arranged so as to cover the transistor elements on plate 40. Providing planarization film 57 makes the surface of TFT panel 10 flat. Plate 40, transistor elements 50, and planarization film 57 constitute TFT panel 10 as a substrate structure.

Organic EL device 1 shown in FIG. 3 has a top emission structure. That is, when voltage is applied between anode 12 and transparent cathode 20, lights are emitted in organic light emitting layer 15, and lights 70 travels outward (upward) through transparent cathode 20 and transparent sealing film 22. Further, among beams of light emitted in organic light emitting layer 15, a light traveling toward the TFT substrate 10 reflects off anode 12, and travels outward (upward) as light 70 through transparent cathode 20 and transparent sealing film 22. Accordingly, it is important that anode 12 be light-reflective.

It is possible to increase the luminous area ratio for organic EL device 1 of top emission structure compared to a general organic EL device of bottom emission structure. This is because, in the case of the top emission structure, transistor elements 50 can be arranged below anode 12, while, in the case of the bottom emission structure, transistor elements 50 or the like need to be arranged on the same plane as anode 12.

Anode 12 is a pixel electrode that is stacked on the surface of TFT substrate 10 and that applies positive voltage to transparent cathode 20 in organic EL device 1. Examples of an anode material, which constitutes anode 12, include Al and Ag, which are metals having high reflectivity, or their alloys (for example, APC). Anode 12 has a thickness of 100 to 300 nm, for example.

Hole injection layer 13 is arranged on the surface of anode 12. As described above, a feature of the present invention lies in that hole injection layer 13 has a photocatalytic function.

Further, in organic EL device 1 of FIG. 3, hole injection layer 13 preferably has light transmittance. This is because, when hole injection layer 13 has high light transmittance, a light emitted in organic light emitting layer 15 can be transmitted to anode 12 without a loss and a reflected light from pixel electrode 12 can be transmitted in the direction of transparent cathode 20 without a loss. In this way, providing hole injection layer 13 with high light transmittance improves the efficiency of light emission of organic EL device 1.

Hole injection layer 13 preferably has a thickness of around 10 to 100 nm, for example. This is because when hole injection layer 13 has a thickness of 100 nm or more, the light transmittance of hole injection layer 13 lowers.

Hole transport layer 14 is arranged on hole injection layer 13. However, hole transport layer 14 may be not provided depending on the performance of hole injection layer 13 or organic light emitting layer 15, which are the layers adjacent to hole transport layer 14.

Organic light emitting layer 15 is arranged on hole transport layer 14. Electron injection layer 18 is arranged on organic light emitting layer 15, and transparent cathode 20 is arranged on electron injection layer 18. Transparent sealing film 22 is arranged on transparent cathode 20.

[Method of Manufacturing Organic EL Device of the Present Invention]

Figure 4:
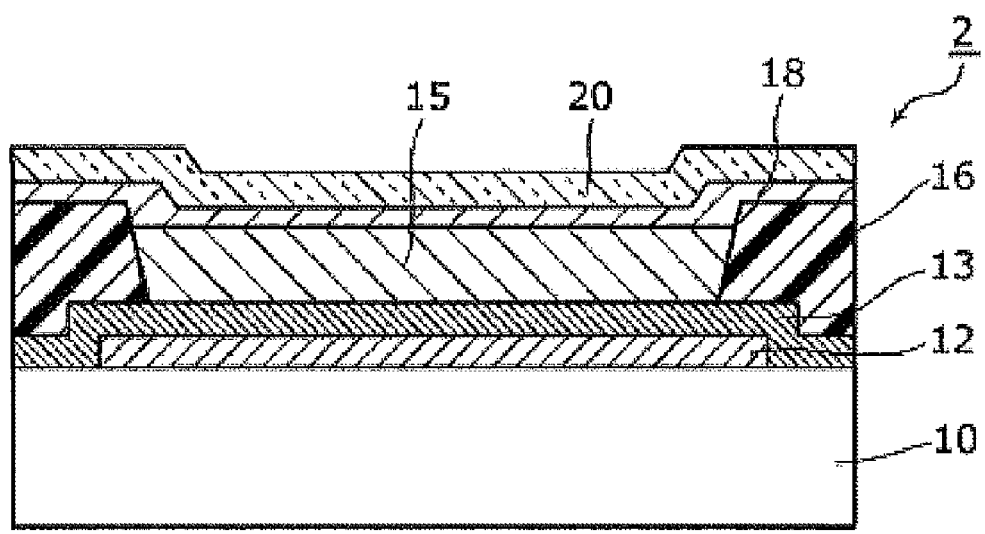
FIG. 4 is a structural cross-sectional view of an organic EL device according to one illustrated embodiment of the present invention.

Next, a method of manufacturing an organic EL device according to one embodiment of the present invention will be described. FIG. 4 is a cross-sectional view of an organic EL device according to one embodiment of the present invention. FIGS. 5A to 5L show a process chart of the method of manufacturing an organic EL device according to one embodiment of the present invention.

Figure 5:
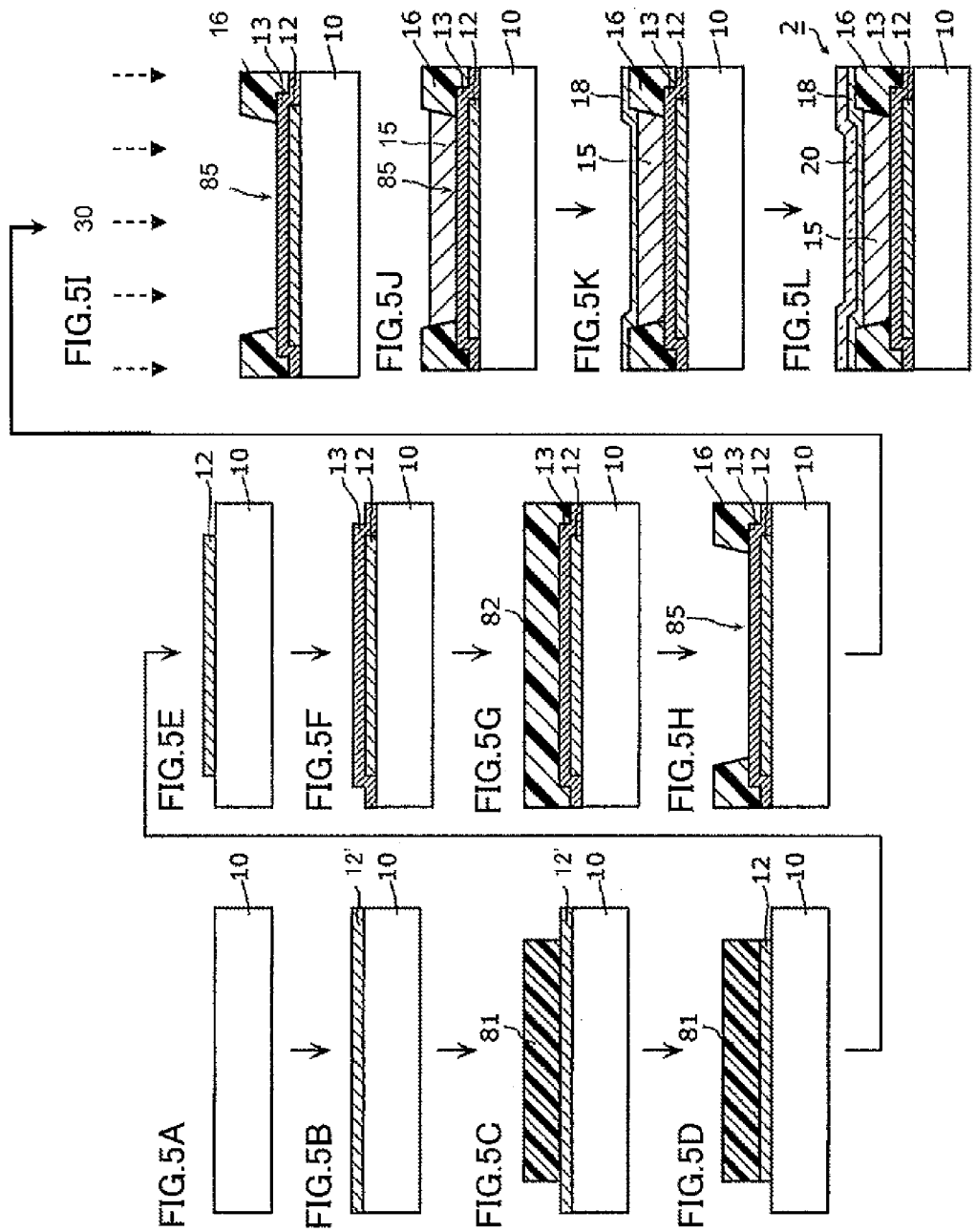
FIGS. 5A to 5L show a flow chart of a method of manufacturing an organic EL device according to one illustrated embodiment of the present invention.

First, as shown in FIG. 5A, TFT panel 10 is provided. As described above, TFT panel 10 includes plate 40, transistor elements 50A and 50B arranged on plate 40, planarization film 57 arranged on plate 40 so as to cover transistor elements.

Next, metal film 12', which will constitute anode 12, is formed on TFT panel 10 (FIG. 5B). It is preferable to form a film made of, for example, Al or Ag or their alloys by sputtering as metal film 12'. In order to form metal film 12' by sputtering, the following process, for example, may be performed: an Ag alloy target and TFT panel 10 are provided in a chamber; the chamber is placed under vacuum and then gases such as argon (Ar) or nitrogen ($N_2$) is introduced into the chamber; and voltage is applied between the target and TFT panel 10. By this means, ions from the gas are produced, and these ions collide with the Ag alloy target to eject particles from the target. The ejected target particles are deposited to the TFT panel, and an Ag alloy film is formed to constitute metal film 12'.

Next, resist mask 81 is formed on metal film 12' (FIG. 5C). Resist mask 81 defines a region in which anode 12 is formed (position and shape). Resist mask 81 may be formed by patterning a photoresist formed on metal film 12' by photolithography.

Next, anode 12 is formed by patterning metal film 12' by wet etching using resist mask 81 as a mask (FIG. 5D). In order to perform wet etching on metal film. 12', for example, a product in process may be immersed in an acid mixed solution containing phosphoric acid, nitric acid, and acetic acid.

Next, resist mask 81 is removed (FIG. 5E). Resist mask 81 is dissolved and removed, by, for example, immersing a product in process in acetone, dimethylformamide, or a commercially available resist remover. After resist mask 81 is removed, the TFT panel is cleaned using isopropylalcohol (IPA) or pure water. The resist is removed in this way.

Next, hole injection layer 13 is formed by sputtering so as to cover anode 12 (FIG. 5F). In order to form hole injection layer 13 by sputtering, the following process, for example, may be performed: sintered $TiO_2$ target is arranged as the target in a chamber together with a product in process; the chamber is placed under vacuum, and then an Ar gas may be introduced into the chamber; voltage is applied between the target and the product in process. By this means, Ar ions are produced and these ions collide with the target to eject particles from the target. The ejected target particles are attached to the product in process so that hole injection layer 13 is formed on anode 12.

Hole injection layer 13 formed may be arranged only in a desired region by being etched. Alternatively, metal film 12' and hole injection layer 13 are formed and then a resist mask is arranged, and hole injection layer 13 and metal film 12' may be etched at the same time (FIG. 5D).

Next, bank 16 is formed. In order to form bank 16, first, a photosensitive resin is applied to TFT panel 10 by slit coating or spin coating so as to cover hole injection layer 13 to form photosensitive resin layer 82 (FIG. 5G). Then, photosensitive resin layer 82 is prebaked, and a solvent contained in photosensitive resin layer 82 is removed.

Next, photosensitive resin layer 82 is exposed with ultraviolet light via a mask (not shown) that defines opening 85. The ultraviolet light is a light with a broad wavelength spectrum having a peak wavelength of 365 nm. In the case where the material of the bank is a positive material, the portions exposed with the ultraviolet light can become dissoluble in an alkaline solution and are removed in the next development process. In contrast, in the case where the material of the bank is a negative material, cross-link reaction proceeds in the portions exposed with ultraviolet light and thus become insoluble in an alkaline solution.

Next, photosensitive resin layer 82 is developed using an alkaline solution. As described above, depending on whether the photosensitive resin is positive or negative, portion's to be dissolved in an alkaline solution is different and the material is dissolved according to exposed patterns. Next, the bank is post-baked to cure the material of the bank. The temperature for post-baking may be around 200° C. and duration for post-baking may be around 60 minutes. Bank 16 thus produced by the above process has a thickness of around 100 to 3,000 nm, for example.

The wettability may be controlled by plasma-treating the surfaces of bank 16 and hole injection layer 13 after the bank is formed. The purpose of the wettability control is to improve the accuracy of coating of an organic material (described later) (FIG. 5J).

Next, the surface of hole injection layer 13 exposed through opening 85 is irradiated with ultraviolet light 30 (FIG. 5I). The light for irradiation preferably has the broad range of wavelength with a main peak of 365 nm. Irradiation time is preferably 1 to 200 minutes. The light source of the light for irradiation may be the light source of the ultraviolet light used for above exposure of photosensitive resin layer 82. By irradiating the hole injection layer having the photocatalytic function with a low-energy ultraviolet light having a long wavelength of 365 nm in this way, bank residues can be removed from the surface of the hole injection layer.

Next, a coating solution of organic light emitting layer 15 is applied in opening 85 of bank 16 (FIG. 5J). The coating solution of organic light emitting layer 15 is applied by, for example, ink jetting. By this means, organic light emitting layer 15 is formed in the region defined by bank 16 (opening 85). Alternatively, before organic light emitting layer 15 is formed, hole transport layer 14 may be formed by ink jetting.

Next, electron injection layer 18 is formed on organic light emitting layer 15 (FIG. 5K). Electron injection layer 18 is formed by, for example, vapor deposition. In order to form electron injection layer 18 by vapor deposition, the following process, for example, may be performed: a crucible containing a Ba material and a product in process are arranged in a chamber; the chamber is placed under vacuum and then the crucible may be heated in the chamber. Examples of the method for heating the crucible include resistance heating, electronic beaming, and high frequency induction. By this means, evaporated Ba is deposited to the product in process to form a Ba film.

Next, transparent cathode 20 is formed on electron injection layer 18 (FIG. 5L). Transparent cathode 20 is obtained by forming by vapor deposition or sputtering a layer (solid layer) that covers electron injection layer 18. In order to form transparent cathode 20 by vapor deposition or sputtering, the following process, for example, may be performed: a crucible containing an ITO material and a product in process are arranged in a chamber; the chamber is placed under vacuum and then the crucible may be heated in the chamber by electronic beaming. By this means, the evaporated ITO is attached to the product in process to form an ITO film. Afterward, the ITO film may be patterned into a certain shape, when necessary.

Finally, transparent sealing film 22 is formed on transparent cathode 20 (see FIG. 3), and as a result, organic EL device 1 of the present embodiment can be obtained. Transparent sealing film 22 may be formed by forming by sputtering a layer (solid layer) to cover transparent cathode 20. In order to form transparent sealing film 22 by sputtering, the following process, for example, may be performed: the SiN target and a product in process are arranged in a chamber; the chamber is placed under vacuum and then an Ar gas is introduced into the chamber; and voltage may be applied between the SiN target and the product in process. By this means, Ar ions are produced and these ions collide with the target to eject particles from the target. The ejected target particles are attached to the product in process to form a SiN film. Afterward, the SiN film may be patterned into a certain shape, when necessary. The patterning means is not limited to wet etching, and may be dry etching.

The following experiments are performed to confirm that bank residues can be removed by virtue of the photocatalytic function of the hole injection layer by using the low-energy ultraviolet light having a long wavelength of 300 to 400 nm.

Experimental Example 1

Titanium oxide ($TiO_x$) film having a thickness of 50 nm is formed by sputtering on a glass substrate measuring 100 mm per side (EAGLE 2000, Matsunami Glass Ind., Ltd.) as a model of the hole injection layer. The deposition condition is set as follows: the target is sintered $TiO_2$, the Ar gas pressure is around 1 Pa, and RF output is 300 W.

Figure 6:
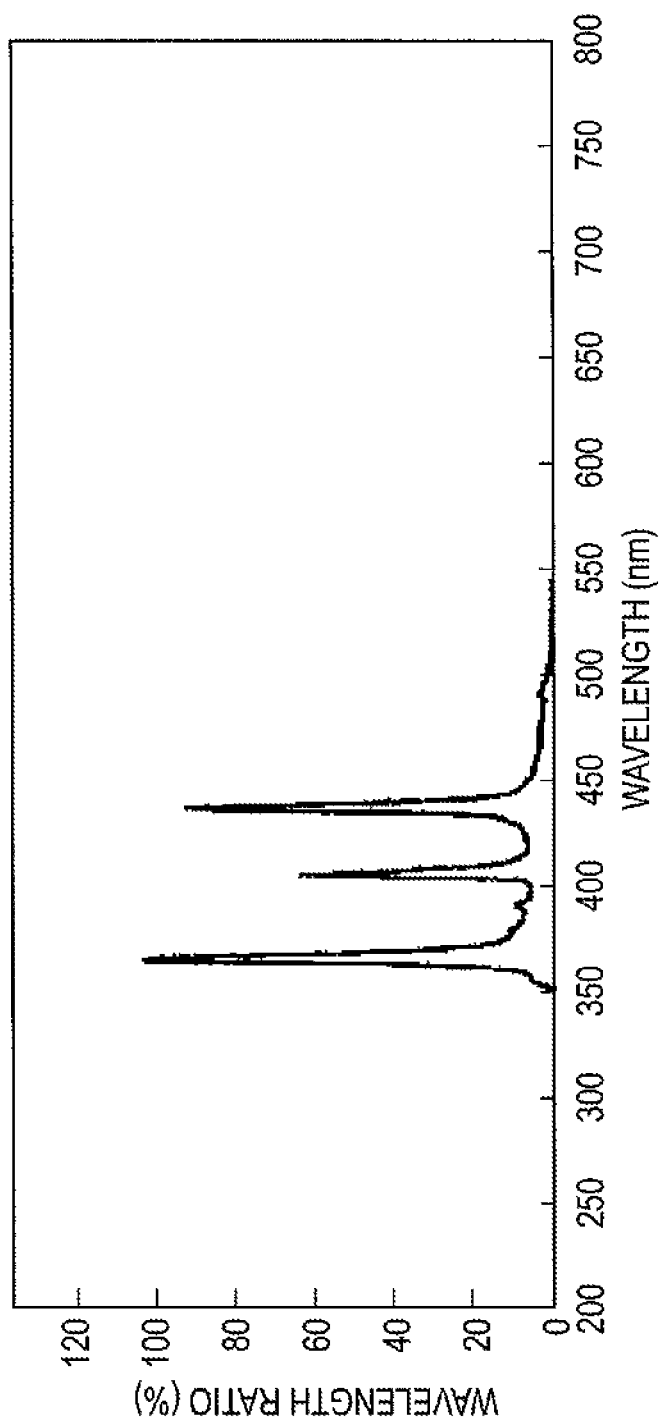
FIG. 6 is a graph showing a spectrum distribution of a light used for irradiation in Experimental Example.

A bank is formed on the formed titanium oxide ($TiO_x$) film by photolithography. An acrylic resin (Asahi Glass Co., Ltd.), the acrylic resin containing fluorine compounds, is used as a material of the bank. Further, as the material of the bank, a negative material, which undergoes cross-link reaction and is cured when being exposed with a light, is used. The bank is patterned a film formed by spin coating by pre-baking a film formed by spin coating at the temperature of 100° C. for two minutes; irradiating the film with ultraviolet light via a photomask; and developing the film using 0.2% of a Tetra Methyl Ammonium Hydroxide (TMAH) aqueous solution (NMD-3, Tokyo Ohka Kogyo Co., Ltd.). As the ultraviolet light, a light with a broad wavelength spectrum having a main peak wavelength of 365 nm is used. The spectrum distribution for the ultraviolet light used for irradiation is shown in FIG. 6. The illuminance for exposure is 20 mW/cm² and exposure time is 1.0 seconds. Next, a sample is made by washing away the developing solution with pure water and then by post-baking the bank in a clean oven at the temperature of 220° C. for 60 minutes.

The made whole sample (the hole injection layer and the bank) is irradiated with ultraviolet light. The ultraviolet light is a broad light with a broad wavelength spectrum having a main peak wavelength of 365 nm. Irradiation time is 200 minutes.

Comparative Example 1

In Comparative Example 1, a sample is made in the same way as Experimental Example 1 except that not the whole sample is irradiated with ultraviolet light.

Comparative Example 2

In Comparative Example 2, a sample is made in the same way as Experimental Example 1 except that tungsten oxide ($WO_x$) is used for the material of the hole injection layer instead of titanium oxide ($TiO_x$).

The condition for depositing a tungsten oxide film (hole injection layer) is set as follows: the target is W (tungsten), sputtering output is 250 W, the flow rate of Ar is 100 sccm, the flow rate of $O_2$ is 100 sccm, and the gas pressure is 4.5 Pa.

Comparative Example 3

In Comparative Example 3, a sample is made in the same way as Experimental Example 1 except that tungsten oxide ($WO_x$) is used for the material of the hole injection layer instead of titanium oxide ($TiO_x$), that the wavelength of the ultraviolet light used for irradiation of the whole sample is 254 nm, and that duration for irradiation with the ultraviolet light is one minute.

Comparative Example 4

In Comparative Example 4, a sample is made in the same way as Experimental Example 1 except that the bank is not formed and that the whole sample is irradiated with no ultraviolet light.

Measurement Method

The contact angle of anisole on the surface of the bank of the made sample is measured using contact angle meter DSA 100 (Sanyo Trading Co., Ltd.). On the other hand, because the bank is not formed in Comparative Example 4, the contact angle of anisole on the surface of the bank is not measured.

Further, elemental analysis is performed on the hole injection layer of the sample by time-of-flight secondary ion mass spectrometry (TOF-SIMS) using TRIFT II (ULVAC-PHI, Inc.). The condition for measurement is as follows: ion to be used for irradiation: $Ga^+$, primary ion energy: 18 keV, ion irradiation area: 30 μm square, and the analysis region: 15×30 μm. Because the typical element of the material of the bank is fluorine (F), F⁻ ions and TiO₂⁻ ions are extracted for the data for measurement, and Table 2 shows the ratio of strength of F⁻ ions normalized by the ratio of strength of the underlying layer (TiO₂⁻ ions or WO₃⁻). The result of the measurement is shown in Table 2.

Result of Measurement

Table 2 shows the amount of bank residues on the hole injection layer that is represented by the ratio of strength of F⁻ ion and shows lyophobicity of the bank that is represented by the contact angle of anisole on the surface of the bank, for Experimental Example 1 and Comparative Examples 1 to 4. Higher ratio of strength of F⁻ ion shows that more bank residues are attached on the hole injection layer, and greater contact angle of anisole on the surface of the bank shows higher lyophobicity of the bank.

TABLE 2

| Sample condition | | Amount of residues on hole injection layer (ratio of strength of F⁻ ion) [counts] | Lyophobicity of bank (contact angle of anisole) [degree] |
|---|---|---|---|
| Experimental Example 1 | $TiO_x$ + UV 365 nm | 2.454 | 46 |
| Comparative Example 1 | $TiO_x$ (without UV) | 1.122 × 10 | 50 |
| Comparative Example 2 | $WO_x$ + UV 365 nm | 1.060 × 10 | 45 |
| Comparative Example 3 | $WO_x$ + UV 254 nm | 1.641 | 23 |
| Comparative Example 4 | $TiO_x$ (without bank) | $3.014 \times 10^{-2}$ | — |

In Experimental Example 1, the ratio of strength of F⁻ ion is 2.454. This is around one tenth the ratio of strength of F⁻ ion (1.122×10) in Comparative Example 1 and the ratio of strength of F⁻ ion (1.060×10) in Comparative Example 2, in which the hole injection layer does not perform the photocatalytic function. Further, the ratio of strength of F⁻ ion (2.454) in Experimental Example 1 is as much as the ratio of strength of F⁻ ion (1.641) in Comparative Example 3 in which the high-energy ultraviolet light having a short wavelength is used for irradiation.

These results suggests that by irradiating the hole injection layer having the photocatalytic function (a titanium oxide film) with a low-energy ultraviolet light having a long wavelength of 365 nm, bank residues can be removed as much as when they are removed with a high-energy ultraviolet light having a short wavelength of 254 nm. This may improve the characteristics of the organic EL device.

On the other hand, in Comparative Example 4, in which the bank is not formed, the ratio of strength of F⁻ ion is 3.014× $10^{-2}$. This result shows that all of the bank residues are not removed in Experimental Example 1.

Further, in Experimental Example 1, the contact angle of anisole on the surface of the bank is 46°. This is the same level as the contact angle of anisole on the surface of the bank of 50° in Comparative Example 1, in which the bank is not irradiated with ultraviolet light. Further, as with Experimental Example 1, the contact angle of anisole on the surface of the bank of 45° in Comparative Example 2, in which the bank is irradiated with the low-energy ultraviolet light having a long wavelength of 300 to 400 nm, is the same level as the contact angle of anisole on the surface of the bank of 50° in Comparative Example 1, in which the bank is not irradiated with ultraviolet light.

This result suggests that lyophobicity of the bank will not disappear even when the bank made of the fluorine-containing resin is irradiated with the low-energy ultraviolet light having a long wavelength of 365 nm. On the other hand, in Comparative Example 3, in which the bank is irradiated with ultraviolet light having a short wavelength, the contact angle of anisole on the surface of the bank is 23°. This result shows that lyophobicity of the bank will disappear when the ultraviolet light having a short wavelength is used for irradiation. When lyophobicity of the bank disappears in this way, the intended function of the bank for holding the coating solution in the region defined by the bank will also disappear.

The above result shows that by irradiating the hole injection layer having the photocatalytic function (titanium oxide film) with the low-energy ultraviolet light having a long wavelength of 365 nm, it is possible to remove the bank residues while retaining lyophobicity of the bank.

Next, the reason will be discussed below why the contact angle of anisole on the surface of the bank is maintained as high as 46°, in Experimental Example 1 and Comparative Example 2, in which the bank is irradiated with ultraviolet light having a long wavelength, while the contact angle of anisole on the surface of the bank drastically decreases to 23° in Comparative Example 3, in which the bank is irradiated with the ultraviolet light having a short wavelength.

Table 3 shows the values (literature values) of the bond energy of molecules, energy of the ultraviolet light, and radical energy. As shown in Table 3, the bond energy between a carbon atom and a fluorine atom is 472 kJ/mol while the energy of the ultraviolet light having a wavelength of 254 nm is 472 kJ/mol. Therefore, in Comparative Example 3, in which the bank is irradiated with the ultraviolet light having a short wavelength of 254 nm, the bond between a carbon atom and a fluorine atom on the surface of the bank is cleaved and the fluorine atom disappears from the surface of the bank. In Comparative Example 3, this may allow lyophobicity of the bank to be lost (the contact angle of anisole on the surface of the bank decreases).

Further, the energy of the ultraviolet light having a wavelength of 365 nm is lower than the energy of C—F bond, being 328 kJ/mol. Therefore, in Experimental Example 1 and Comparative Example 2, in which the bank is irradiated with the ultraviolet light having a long wavelength of 365 nm, it has been suggested that the carbon-fluorine bonds are not be cleaved and fluorine remains on the surface of the bank.

Further, in Experimental Example 1, moisture in the air is reduced to produce OH⁻ radicals by irradiating titanium oxide ($TiO_x$) with the ultraviolet light. It has been suggested that these OH⁻ radicals decomposes organic substances on the hole injection layer so that the bank residues on the hole injection layer has decreased.

On the other hand, it has also been suggested that the OH⁻ radicals attack the carbon-fluorine bonds on the surface of the bank at the same time. However, a fluorine atom has a strong electron withdrawing property and is negatively charged. For this reason, negatively-charged OH⁻ and CF⁻ repulse from each other. By this means, it has been suggested that the attack against the carbon-fluorine bonds by the OH⁻ radicals is alleviated. As described above, it has been suggested that in Experimental Example 1, in which the bank is provided with the photocatalytic function, the cleavage of the carbon-fluorine bond is suppressed on the surface of the bank and thus fluorine remains on the surface of the bank, consequently allowing the bank to maintain lyophobicity.

TABLE 3

|  | (Bond) energy kJ/mol |
| --- | --- |
| H—C bond (CH₃) | 457 |
| C—F bond (CH₃F) | 472 |
| Ultraviolet light (wavelength: 254 nm) | 472 |
| Ultraviolet light (wavelength: 365 nm) | 328 |
| OH⁻ radical | 465 |

This application is entitled and claims the benefit of Japanese Patent Application No. 2009-276825, filed on Dec. 4, 2009, the disclosure of which including the specification, drawings and abstract is incorporated herein by reference in its entirety.

INDUSTRIAL APPLICABILITY

According to the present invention, it is possible to retain lyophobicity of the bank while removing bank residues from the surface of the hole injection layer, making it possible to make an excellent organic EL device by the printing method having the high productivity. For this reason, according to the present invention, a large organic EL panel (for example, 100-inch class) can be made inexpensively. Therefore, the present invention is useful as a light-emitting source for pixels of a display device, a back light of a crystal liquid display, and light sources for various lighting, and is useful in particular as an organic EL display panel of active matrix type combined with TFTs.

| 1, 2 | organic EL device |
| --- | --- |
| 10 | TFT panel |
| 12 | anode |
| 13 | hole injection layer |
| 14 | hole transport layer |
| 15 | organic light emitting layer |
| 16 | bank |
| 18 | electron injection layer |
| 20 | transparent cathode |
| 22 | transparent sealing film |
| 30 | ultraviolet light |
| 40 | plate |
| 50 | transistor element |
| 50A, 50B | TFT |
| 51 | source/drain electrode |
| 52 | semiconductor layer |
| 53 | gate insulation film |
| 54 | gate electrode |
| 55 | interconnection |
| 57 | planarization film |
| 70 | light |
| 81 | resist mask |
| 82 | photosensitive resin layer |
| 85 | opening |

The invention claimed is:

1. An organic EL device comprising: a pixel electrode arranged on a substrate; a hole injection layer arranged on the pixel electrode, the hole injection layer made of a metal oxide having a photocatalytic function; an organic functional layer formed on the hole injection layer by coating; a bank made of a fluorine-containing resin, the bank defining a region in which the organic functional layer is arranged; and a counter electrode arranged so as to cover the bank and the organic functional layer, wherein
the hole injection layer and the bank contact each other, and a fluorine atom concentration on the hole injection layer is 0.1 atom % or less, and an anisole contact angle on a top surface of the bank is 40 to 50°.

2. The organic EL device according to claim 1, a fluorine atom concentration on the top surface of the bank is 5 to 10 atom %.

3. The organic EL device according to claim 1, the bank is made in a forward tapered shape, in which a bottom surface of the bank is larger than the top surface of the bank.

4. The organic EL device according to claim 1, wherein the hole injection layer contains titanium oxide.

5. The organic EL device according to claim 4, wherein the hole injection layer further contains tungsten oxide.

6. The organic EL device according to claim 4, wherein the hole injection layer further contains molybdenum oxide.

7. An organic EL display panel comprising the organic EL device according to claim 1.

8. A method of manufacturing an organic EL device comprising:
providing a substrate;
forming a pixel electrode on the substrate;
forming on the pixel electrode a hole injection layer made of a metal oxide having a photocatalytic function;
forming a bank made of a fluorine-containing resin on the substrate so that at least part of the hole injection layer is exposed;
irradiating the hole injection layer with a ultraviolet light after the bank is formed, the ultraviolet light containing no light having wavelength of less than 300 nm;
forming an organic functional layer on the hole injection layer by coating; and
forming a counter electrode on the organic functional layer.

9. The method of manufacturing the organic EL device according to claim 8, wherein a peak wavelength of the ultraviolet light is 300 to 400 nm.

10. The method of manufacturing the organic EL device according to claim 8, wherein the light having wavelength of less than 300 nm is removed from a ultraviolet light with a cut filter.

11. The organic EL device according to claim 1, a bottom surface of the bank contacts an upper surface of the hole injection layer.

* * * * *